(12) United States Patent
Chia

(10) Patent No.: US 7,902,676 B2
(45) Date of Patent: Mar. 8, 2011

(54) STACKED SEMICONDUCTOR DEVICE AND FABRICATING METHOD THEREOF

(75) Inventor: Kan-Jung Chia, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 109 days.

(21) Appl. No.: 12/246,364

(22) Filed: Oct. 6, 2008

(65) Prior Publication Data

US 2009/0090541 A1  Apr. 9, 2009

(30) Foreign Application Priority Data

Oct. 4, 2007  (TW) ................................ 96137211 A

(51) Int. Cl.
*H01L 23/02* (2006.01)
*H01L 23/34* (2006.01)

(52) U.S. Cl. ......... 257/777; 257/723; 257/738; 257/686; 257/778; 257/734; 257/E21.503; 257/E21.511; 257/E23.063; 257/E23.169; 257/E27.137; 438/106; 438/125; 438/109; 438/107; 438/105

(58) Field of Classification Search ................... 257/777
See application file for complete search history.

(56) References Cited

U.S. PATENT DOCUMENTS

| 7,306,957 B2* | 12/2007 | Wada et al. ...................... 438/14 |
| 7,759,167 B2* | 7/2010 | Vanfleteren et al. ........... 438/118 |
| 2004/0178489 A1* | 9/2004 | Sippola .......................... 257/686 |
| 2005/0205291 A1* | 9/2005 | Yamashita et al. ............. 174/254 |
| 2005/0275088 A1* | 12/2005 | Sakurai et al. ................. 257/723 |
| 2007/0125572 A1* | 6/2007 | Hsu ............................... 174/260 |

* cited by examiner

*Primary Examiner* — Thanh V Pham
*Assistant Examiner* — Mohammad Choudhry
(74) *Attorney, Agent, or Firm* — Schmeiser, Olsen & Watts LLP

(57) ABSTRACT

Provided is a stacked semiconductor device including a first flexible layer and a second flexible layer combined together, serving as a flexible substrate body being bent somewhere such that a surface of the first flexible layer itself is face-to-face clipped, two semiconductor chips each embedded in the flexible substrate body, and an adhesive layer sandwiched in a gap between the face-to-face surface of the first flexible layer. The active surface of each of the semiconductor chips has plurality of electrode pads thereon electrically connected to a first circuit layer on the second flexible layer. The semiconductor chips are stacked up and embedded in the flexible substrate body, thereby reducing package height to achieve miniaturization of electronic products. A method for fabricating the stacked semiconductor device is also provided.

16 Claims, 6 Drawing Sheets

STACKED SEMICONDUCTOR DEVICE AND FABRICATING METHOD THEREOF

BACKGROUND OF THE INVENTION

1. Field of the Invention

The present invention relates to stacked semiconductor devices and methods for fabricating the same, and more particularly, to a stacked semiconductor device and a method for fabricating the same, wherein the method comprises bending and stacking up semiconductor chip-embedded flexible packaging substrates.

2. Description of the Prior Art

Owing to development of semiconductor packaging technology, semiconductor packages nowadays come in a variety of forms. Known methods for packaging semiconductor devices involve mounting an integrated circuit-laden semiconductor chip on a packaging substrate or a lead frame, electrically connecting the semiconductor chip to the packaging substrate or the lead frame, and encapsulating the packaging substrate with encapsulant. Known semiconductor packages are typically modularized using multi-chip module (MCM) in order to enhance electrical functions of a semiconductor chip, meet the packaging requirements for integration and miniaturization of semiconductor packages, enhance the performance and capacity of a single semiconductor package, and get in line with the trend toward miniaturization, high capacity, and high speed of electronic products. Also, multi-chip modularization downsizes semiconductor packages and enhances electrical functions thereof and therefore has become a mainstream packaging technology. Multi-chip modularization involves mounting at least two semiconductor chips on a chip carrier of a single package, with each of the two semiconductor chips being stacked on the chip carrier. Also, to enhance the electrical functionality of a semiconductor device, semiconductor manufacturers developed a semiconductor package (Package on Package) technology which involves electrically connecting two semiconductor packages (a semiconductor package comprising a semiconductor chip and a carrier, and another semiconductor chip package of a different type or with electrical functionality different from that of the aforesaid semiconductor package) to one another by conductive components, such as solder balls, so as to provide enhanced electrical functionality. Semiconductor devices of this kind are commonly known as stacked package on package.

Referring to FIGS. 1A through 1C, which are cross-sectional views of a fabrication method disclosed in U.S. Pat. No. 6,879,047, a flexible substrate 10 with a first surface 10a, an opposing second surface 10b, and a plurality of openings 100 formed therein to penetrate the first and second surfaces 10a, 10b is provided. A plurality of connecting pads 101 are formed at one end of corresponding ones of the openings 100, respectively, so as to be electrically connected to the flexible substrate 10. As shown in the drawings, at least a first semiconductor package 11 and at least a second semiconductor package 12 are provided. The first semiconductor package 11 comprises a packaging substrate 110 and first and second semiconductor chips 111, 112 mounted on a surface of the packaging substrate 110. The first and second semiconductor chips 111, 112 are electrically connected to the packaging substrate 110 by a plurality of metal wires 113. The metal wires 113 and the first and second semiconductor chips 111, 112 are encapsulated by an encapsulant 114. A plurality of conductive components 115 are formed on another surface of the packaging substrate 110. The second semiconductor package 12, which has the same structural features as the first semiconductor package structure 11, comprises a packaging substrate 120 and first and second semiconductor chips 121, 122 mounted on a surface of the packaging substrate 120. The first and second semiconductor chips 121, 122 are electrically connected to the packaging substrate 120 by a plurality of metal wires 123. The first and second semiconductor chips 121, 122 and the metal wires 123 are encapsulated by an encapsulant 124. A plurality of conductive components 125 (shown in FIG. 1A) are formed on another surface of the packaging substrate 120. The first and second semiconductor packages 11, 12 are electrically connected to the connecting pads 101 on the flexible substrate 10 via the conductive components 115, 125, thereby allowing the first semiconductor package 11 to be electrically connected to the second semiconductor package 12 via the flexible substrate 10 (shown in FIG. 1B). The first semiconductor package 11 is flipped over to be superimposed on the second semiconductor package 12 such that the first semiconductor package 11 is stacked on the second semiconductor package 12. The first and second semiconductor packages 11, 12 are electrically connected to one another by the flexible substrate 10, and a plurality of solder balls 13 are formed on the bottom surface of the flexible substrate 10 so as to be electrically connected to another electronic device (shown in FIG. 1C), allowing a stacked semiconductor device to be formed.

The steps of mounting the first semiconductor chips 111, 112 and the second semiconductor chips 121, 122 on the packaging substrates 110, 120, proceeding to encapsulation, and electrically connecting the first and second semiconductor packages 11, 12 to one another by the flexible substrate 10 are intricate and difficult, because the steps entail an encapsulation process, stacking, and electrical connection. Also, with the first and second semiconductor packages 11, 12 mounted on the flexible substrate 10, the packages are tall, rather than short, and in consequence the stacked semiconductor device fabricated is rather tall to the detriment of miniaturization.

Accordingly, an issue that calls for immediate solution involves solving the drawbacks of the prior art, namely unfavorably great height of conventional stacked semiconductor devices and an intricate fabrication process thereof.

SUMMARY OF THE INVENTION

To overcome the aforesaid drawbacks of the prior art, it is a primary objective of the present invention to provide a stacked semiconductor device and a method for fabricating the same so as to reduce stack height and thereby achieve package miniaturization.

Another objective of the present invention is to provide a stacked semiconductor device and a method for fabricating the same so as to simplify a fabrication process and reduce manufacturing costs.

To achieve the above and other objectives, the present invention provides a stacked semiconductor device, comprising: a first flexible layer and a second flexible layer combined together, serving as a flexible substrate body, the second flexible layer having a surface with a first circuit layer disposed thereon, and the flexible substrate body being bent somewhere such that a surface of the first flexible layer itself is face-to-face clipped; at least two semiconductor chips each embedded in the flexible substrate body, between the first and second flexible layers, and having an active surface and an opposing inactive surface, wherein the active surface has a plurality of electrode pads thereon and electrically connected to the first circuit layer by a plurality of first conductive vias disposed in the second flexible layer; and an adhesive layer sandwiched in a gap between the face-to-face surface of the first flexible layer so as to stack up the semiconductor chips.

The first circuit layer has a plurality of conductive pads. Also, an insulated protective layer is disposed on the second flexible layer and the first circuit layer and has a plurality of openings therein so as to expose the conductive pads, respectively.

In the stacked semiconductor device above, the flexible substrate body is further bent elsewhere such that a surface of the insulated protective layer itself is face-to-face clipped. Another adhesive layer is sandwiched in a gap between the face-to-face surface of the insulated protective layer so as to stack up another semiconductor chips.

In another embodiment of the present invention, a circuit build-up structure is disposed on the second flexible layer and the first circuit layer. The circuit build-up structure comprises at least a dielectric layer, a second circuit layer disposed on the dielectric layer, and a plurality of second conductive vias disposed in the dielectric layer and electrically connecting to the second circuit layer, in which a portion of the second conductive vias electrically connect to the first circuit layer, and the outmost second circuit layer has a plurality of conductive pads. An insulated protective layer is disposed on the circuit build-up structure. The insulated protective layer has a plurality of openings therein so as to expose the conductive pads, respectively.

In the aforesaid embodiment, the flexible substrate body is further bent elsewhere such that a surface of the insulated protective layer itself is face-to-face clipped, and another adhesive layer is sandwiched in a gap between the face-to-face surface of the insulated protective layer so as to stack up another semiconductor chips.

The present invention further provides a method for fabricating a stacked semiconductor device, comprising the steps of: providing a first flexible layer and a second flexible layer; sandwiching in at least two semiconductor chips between the first and second flexible layers, then combining together the first and second flexible layers to serve as a flexible substrate body with the semiconductor chips embedded therein, wherein each of the semiconductor chips has an active surface with a plurality of electrode pads thereon and an opposing inactive surface; forming a first circuit layer on the second flexible layer, also forming a plurality of first conductive vias in the second flexible layer, electrically connecting the first circuit layer and the electrode pads; forming an adhesive layer on a portion of the first flexible layer; and bending somewhere the flexible substrate body so as to allow the adhesive layer to adhere to an adhesive-layer-free portion of the first flexible layer, such that a surface of the first flexible layer itself is face-to-face clipped, thereby stacking up the semiconductor chips.

As regarding the method above, the first circuit layer has a plurality of conductive pads.

The method further comprises the steps of forming an insulated protective layer on the second flexible layer and first circuit layer, forming a plurality of openings in the insulated protective layer so as to expose the conductive pads respectively.

The method above further comprises forming another adhesive layer on a portion of the insulated protective layer and then bending elsewhere the flexible substrate body so as to allow the adhesive layer to adhere to an adhesive-layer-free portion of the insulated protective layer, such that a surface of the insulated protective layer itself is face-to-face clipped, thereby stacking up another semiconductor chips.

In another embodiment of the present invention, a circuit build-up structure is formed on the second flexible layer and the first circuit layer. The circuit build-up structure comprises at least a dielectric layer, a second circuit layer formed on the dielectric layer, and a plurality of second conductive vias formed in the dielectric layer and electrically connecting to the second circuit layer, in which a portion of the second conductive vias electrically connect to the first circuit layer, and the outmost second circuit layer has a plurality of conductive pads. An insulated protective layer is formed on the circuit build-up structure. A plurality of openings are formed in the insulated protective layer so as to expose the conductive pads, respectively.

In yet another embodiment of the present invention, the method disclosed in the present invention further comprises a step of forming another adhesive layer on a portion of the insulated protective layer and then bending elsewhere the flexible substrate body so as to allow the adhesive layer to adhere to an adhesive-layer-free portion of the insulated protective layer, such that a surface of the insulated protective layer itself is face-to-face clipped, thereby stacking up another semiconductor chips.

The present invention provides a stacked semiconductor device and a method for fabricating the same. The method comprises the steps of: sandwiching at least two semiconductor chips in between a first flexible layer and a second flexible layer combined together to serve as a flexible substrate body with the semiconductor chips embedded therein, wherein a first circuit layer is formed on the second flexible layer and electrically connected to the semiconductor chips; bending the flexible substrate body and sandwiching in an adhesive layer between a face-to-face surface of the first flexible layer, so as to form a stack structure of the semiconductor chips. With the semiconductor chips being stacked up and embedded in between the first and second flexible layers, reduction of package height and package miniaturization can be achieved. Bending the flexible substrate body to stack up the semiconductor chips simplifies a fabrication process and reduces costs.

BRIEF DESCRIPTION OF THE DRAWINGS

FIG. 2I' illustrates another embodiment corresponding to the first embodiment shown in FIG. 2I;

FIG. 2K' illustrates another embodiment corresponding to the first embodiment shown in FIG. 2K.

DETAILED DESCRIPTION OF THE EMBODIMENTS

The present invention is herein illustrated with specific embodiments, so that one ordinarily skilled in the pertinent art can easily understand other advantages and effects of the present invention from the disclosure of the invention.

First Embodiment

FIGS. 2A through 2K are cross-sectional views of a stacked semiconductor device and a method for fabricating the same according to the present invention.

Figure 1A:
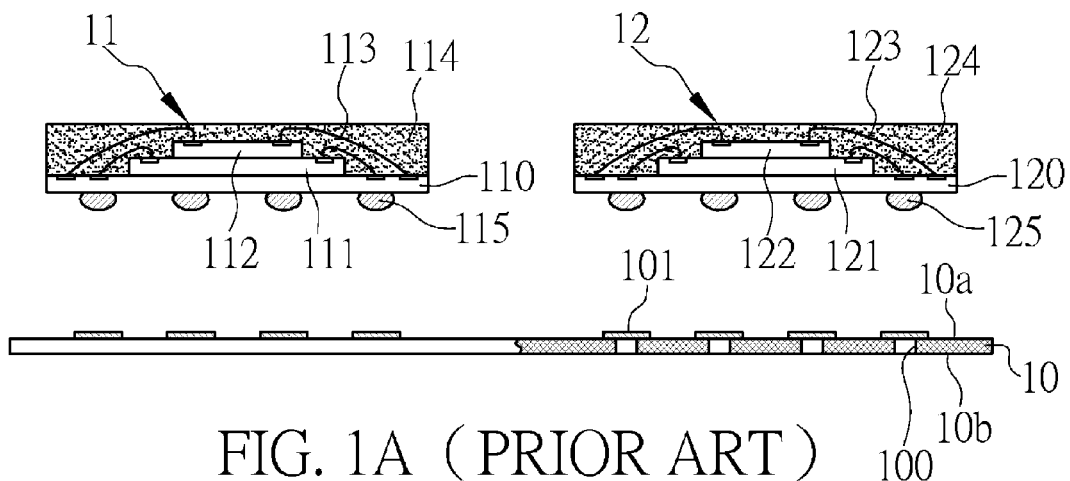
FIGS. 1A through 1C (PRIOR ART) are cross-sectional views of a fabrication method disclosed in U.S. Pat. No. 6,879,047.
Figure 1B:
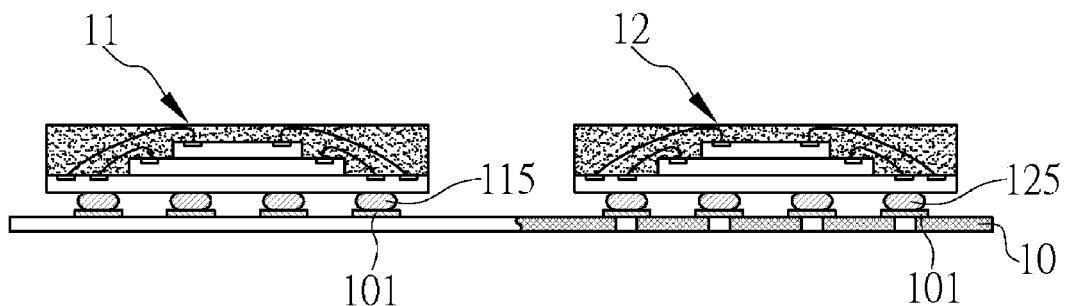
Figure 1C:
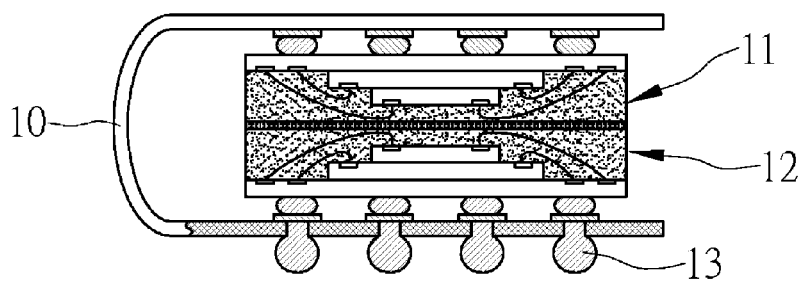
Figure 2A:
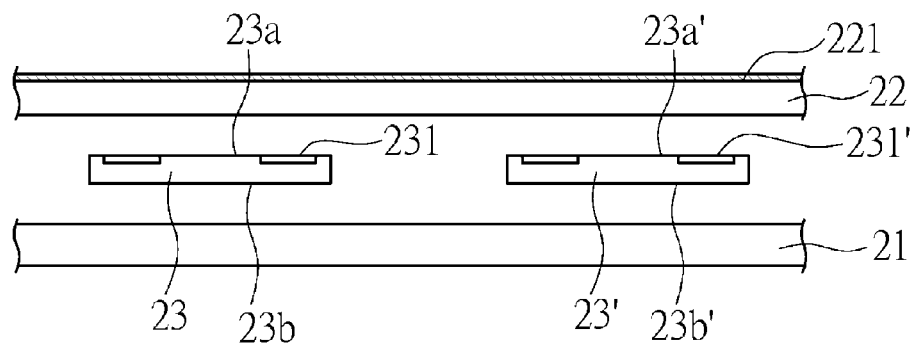
FIGS. 2A through 2K are cross-sectional views of a first embodiment of a stacked semiconductor device and a method for fabricating the same according to the present invention.

Referring to FIG. 2A, a first flexible layer 21 and a second flexible layer 22 and at least two semiconductor chips 23, 23' are provided. A metal layer 221 is formed on the second flexible layer 22. Each of the semiconductor chips 23, 23' has an active surface 23a, 23a' with a plurality of electrode pads 231, 231' thereon and an opposing inactive surface 23b, 23b'.

Figure 2B:
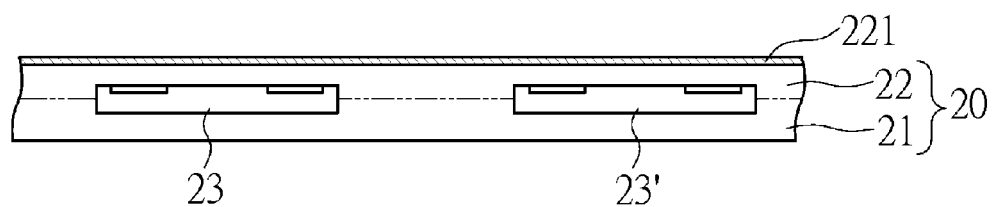

Referring to FIG. 2B, the semiconductor chips 23, 23' are each sandwiched in between the first and second flexible layers 21, 22, then the first and second flexible layers 21, 22 are combined together to serve as a flexible substrate body 20 with the semiconductor chips 23, 23' embedded therein.

Figure 2C:
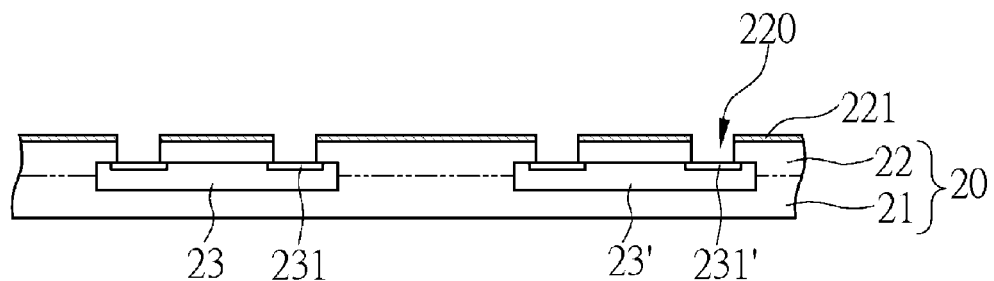

Referring to FIG. 2C, a plurality of vias 220 are formed in the second flexible layer 22 and the metal layer 221 thereon so as to expose a portion of the electrode pads 231, 231' on the semiconductor chips 23, 23' embedded in between the flexible substrate body 20.

Figure 2D:
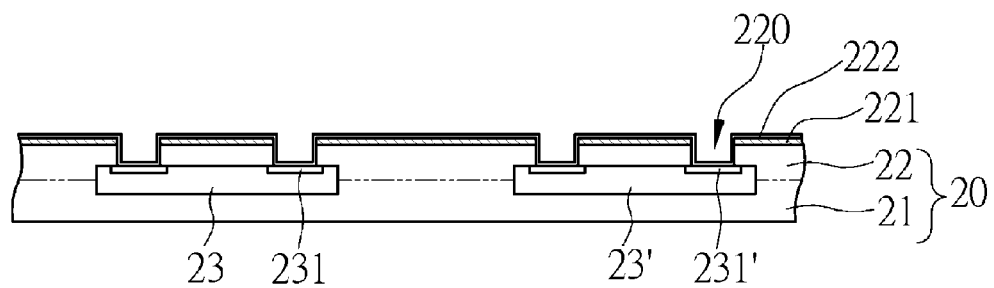

Referring to FIG. 2D, a conductive layer 222 is formed on the metal layer 221, surfaces of vias 220, and a portion of the electrode pads 231, 231' by physical deposition or chemical deposition, such as sputtering, evaporation, arc vapor deposition, ion beam sputtering, laser ablation deposition, plasma-enhanced chemical vapor deposition, or electroless plating.

Figure 2E:
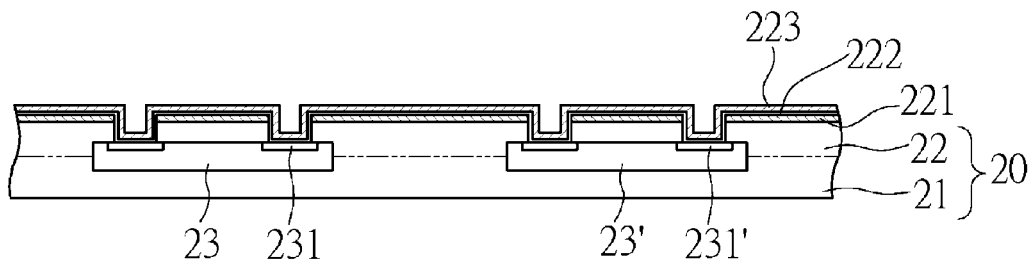

Referring to FIG. 2E, with the conductive layer 222 functioning as an electrical conduction path, an electroplated metal layer 223 is formed on the conductive layer 222.

Figure 2F:
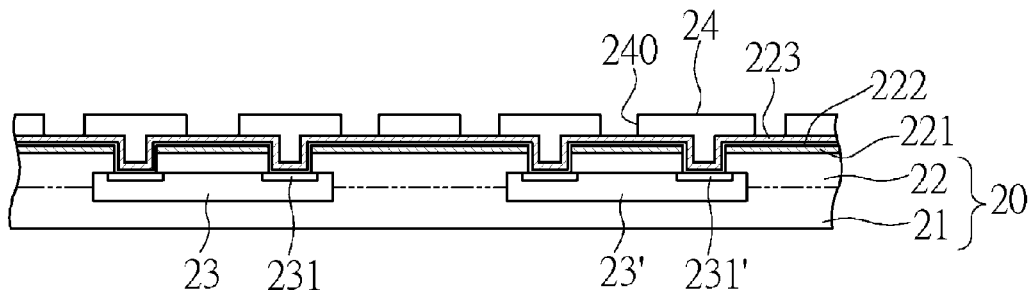

Referring to FIG. 2F, a resist layer 24 is formed on the electroplated metal layer 223, and then the resist layer 24 undergoes a patterning process including exposure and development so as for a plurality of open areas 240 to be formed in the resist layer 24 to expose a portion of the electroplated metal layer 223.

Figure 2G:
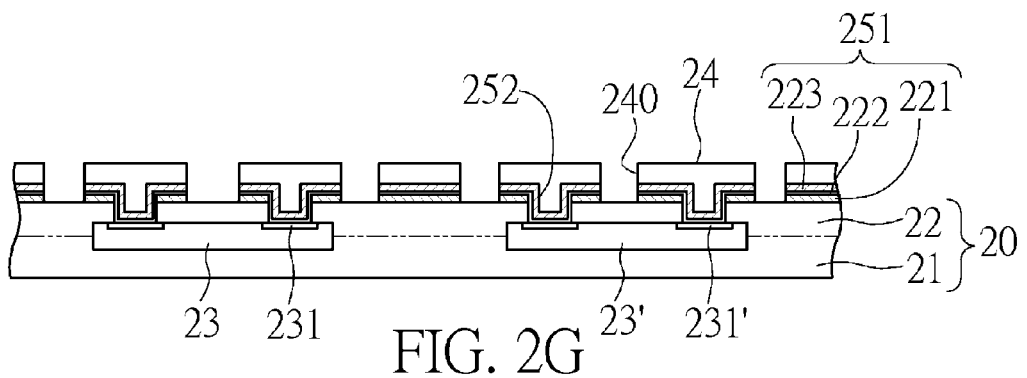

Referring to FIG. 2G, portions of the electroplated metal layer 223, conductive layer 222, and metal layer 221 exposed from the open areas 240 of the resist layer 24 are removed so as to form a first circuit layer 251, also a plurality of first conductive vias 252 are formed in the second flexible layer, electrically connecting the first circuit layer 251, and the electrode pads 231, 231' on the semiconductor chips 23, 23'.

Figure 2H:
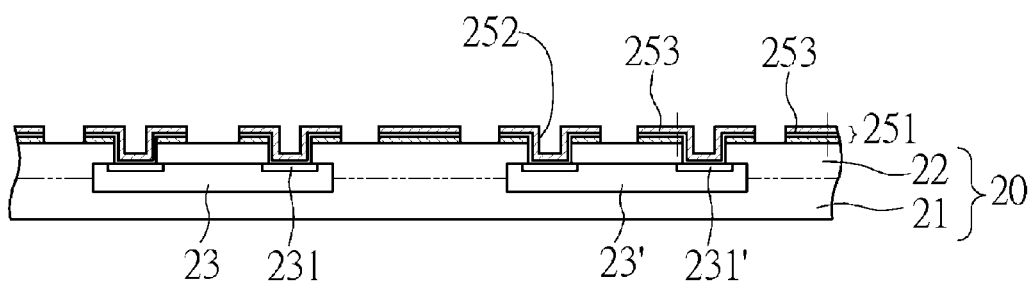

Referring to FIG. 2H, the resist layer 24 is removed from the first circuit layer 251 thereunder, leaving the first circuit layer 251 exposed. Now, the first circuit layer 251 has a plurality of conductive pads 253.

Figure 2I:
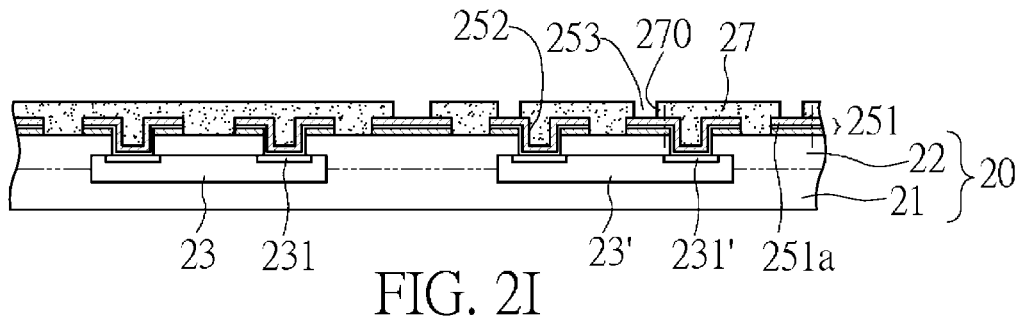
Figure 2I:
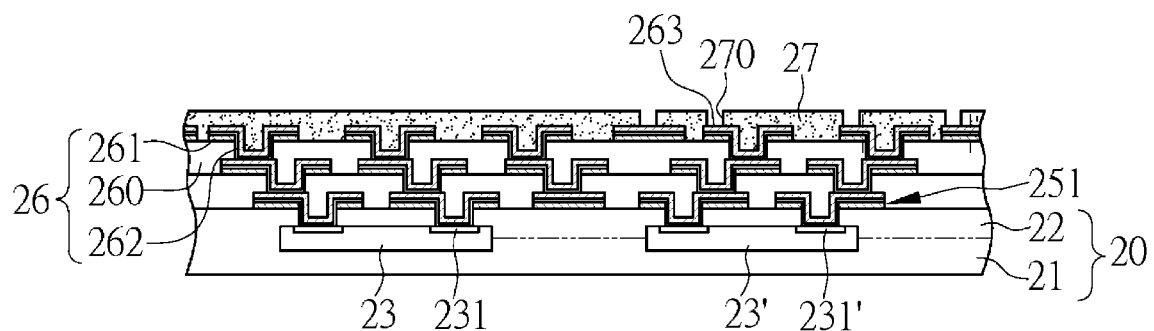

Referring to FIG. 2I, an insulated protective layer 27 is formed on the second flexible layers 22 and the first circuit layer 251, and then a plurality of openings 270 are formed in the insulated protective layer 27 so as to expose the conductive pads 253, respectively. As shown in FIG. 2I', alternatively, a circuit build-up structure 26 is formed on the second flexible layer 22 and the first circuit layer 251. The circuit build-up structure 26 comprises at least a dielectric layer 260, a second circuit layer 261 formed on the dielectric layer 260, and a plurality of second conductive vias 262 formed in the dielectric layer 260 and electrically connected to the second circuit layer 261. A portion of the second conductive vias 262 is electrically connected to the first circuit layer 251, and the outmost second circuit layer 261 has a plurality of conductive pads 263. An insulated protective layer 27 is formed on the circuit build-up structure 26. A plurality of openings 270 are formed in the insulated protective layer 27 so as to expose the conductive pads 263, respectively.

The following description is based on FIG. 2I.

Figure 2J:
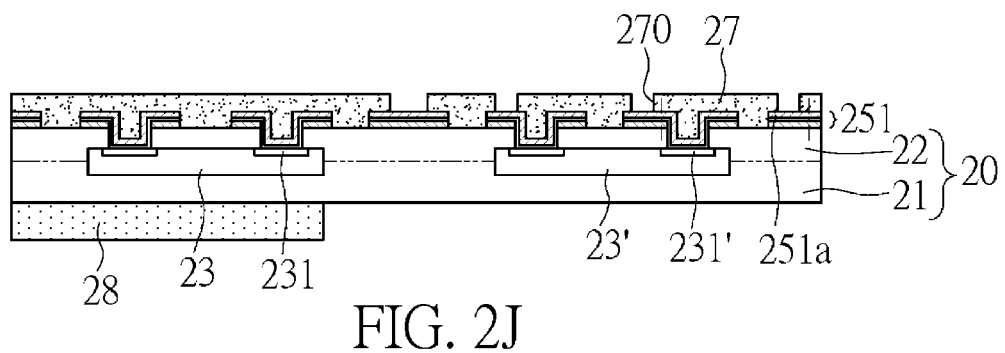

Referring to FIG. 2J, an adhesive layer 28 is formed on a portion of the first flexible layer 21.

Figure 2K:
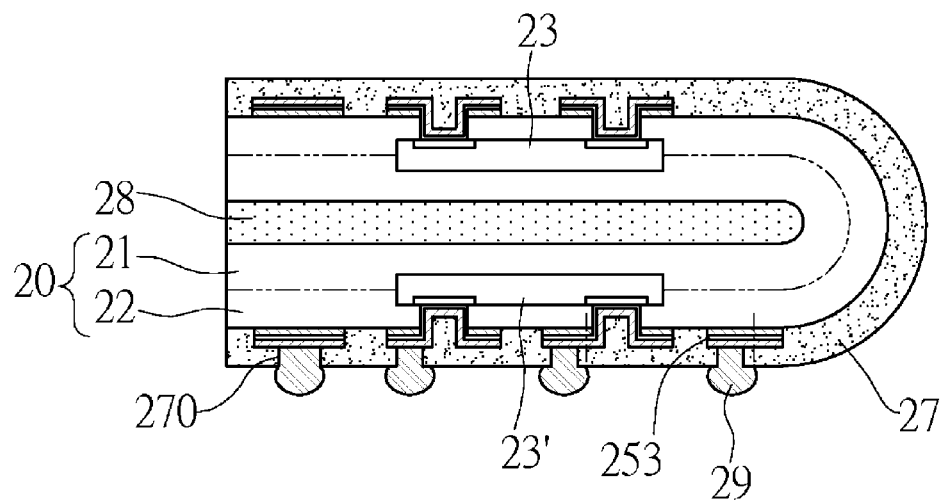
Figure 2K:
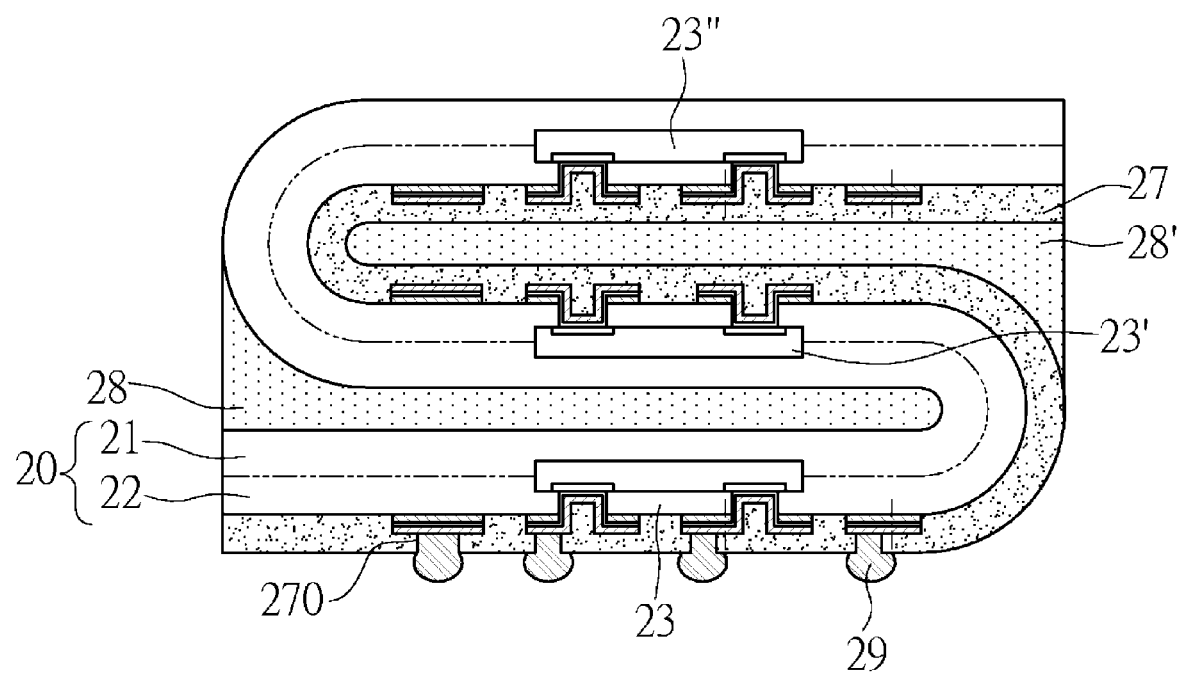

Referring to FIGS. 2K and 2K', the flexible substrate body 20 is bent somewhere so as to allow the adhesive layer 28 to adhere to an adhesive-layer-free portion of the first flexible layer 21 (free of the adhesive layer 28); as a result, the semiconductor chip 23 is stacked on the semiconductor chip 23'. Formed in the openings 270 of the insulated protective layer 27 are a plurality of conductive components 29 functioning as solder balls to be electrically connected to the conductive pads 253, respectively, as shown in FIG. 2K. Moreover, another adhesive layer 28' is formed on a portion of the insulated protective layer 27 and then bend elsewhere the flexible substrate body 20 so as to allow the adhesive layer 28' to adhere to an adhesive-layer-free portion of the insulated protective layer 27 (free of the adhesive layer 28'); as a result, the semiconductor chips 23, 23', 23" are stacked up, as shown in FIG. 2K'.

The present invention further provides a stacked semiconductor device, as shown in FIG. 2K. The stacked semiconductor device comprises a first flexible layer 21, a second flexible layer 22, at least two semiconductor chips 23, 23', and an adhesive layer 28. A first circuit layer 251 is disposed on the second flexible layer 22. The first circuit layer 251 has a plurality of conductive pads 253 thereon. The semiconductor chips 23, 23' are each sandwiched in between the first and second flexible layers 21, 22 and have active surfaces 23a, 23a' and opposing inactive surfaces 23b, 23b', respectively. The active surface 23a, 23a' has a plurality of electrode pads 231, 231' thereon electrically connected to the first circuit layer 251 by a plurality of first conductive vias 252 disposed in the second flexible layer 22. An adhesive layer 28 is sandwiched in a gap between a face-to-face surface of the first flexible layer 21, allowing the semiconductor chip 23 to be stacked on the semiconductor chip 23'.

As mentioned earlier, the first circuit layer 251 comprises the metal layer 221, the conductive layer 222 on the metal layer 221, and the electroplated metal layer 223 on the conductive layer 222. Furthermore, the insulated protective layer 27 is disposed on the second flexible layer 22 and the first circuit layer 251. The openings 270 are disposed in the insulated protective layer 27 so as to expose the conductive pads 253, respectively. Disposed in the openings 270 of the insulated protective layer 27 are the conductive components 29 functioning as solder balls to be electrically connected to the conductive pads 253, respectively.

As mentioned earlier, as shown in FIG. 2K', the flexible substrate body 20 is further bent elsewhere such that a surface of the insulated protective layer 27 itself is face-to-face clipped. Another adhesive layer 28' is sandwiched in a gap between the face-to-face surface of the insulated protective layer 27 so as to stack up another semiconductor chip 23".

In another embodiment of the present invention, as shown in FIG. 2I', a circuit build-up structure 26 is disposed on the second flexible layer 22 and the first circuit layer 251. The circuit build-up structure 26 comprises the at least a dielectric layer 260, a second circuit layer 261 disposed on the dielectric layer 260, and a plurality of second conductive vias 262 disposed in the dielectric layer 260 and electrically connecting to the second circuit layer 261, in which a portion of the second conductive vias 262 electrically connect to the first circuit layer 251, and the outmost second circuit layer 261 has a plurality of conductive pads 263. An insulated protective layer 27 is disposed on the circuit build-up structure 26, having a plurality of openings 270 therein so as to expose the conductive pads 263. A plurality of conductive components 29 functioning as solder balls to electrically connecting to the conductive pads 263 are disposed in the openings 270 of the insulated protective layer 27.

In the embodiment above, the flexible substrate body 20 is further bent elsewhere such that a surface of the insulated protective layer 27 itself is face-to-face clipped, and another adhesive layer 28' is sandwiched in a gap between the faceto-face surface of the insulated protective layer 27 so as to stack up another semiconductor chips. 23" (not shown in the FIGs).

Second Embodiment

Figure 3A:
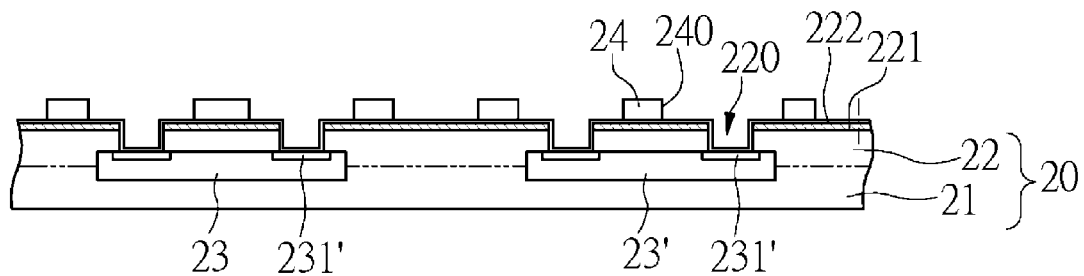
FIGS. 3A through 3C are cross-sectional views of a second embodiment of a stacked semiconductor device and a method for fabricating the same according to the present invention.
Figure 3B:
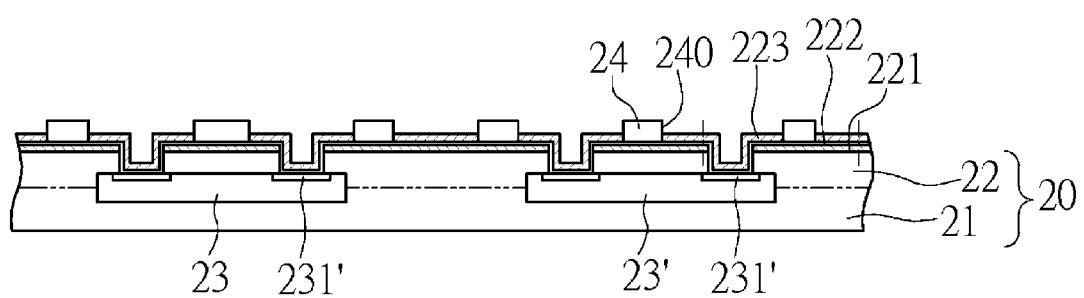
Figure 3C:
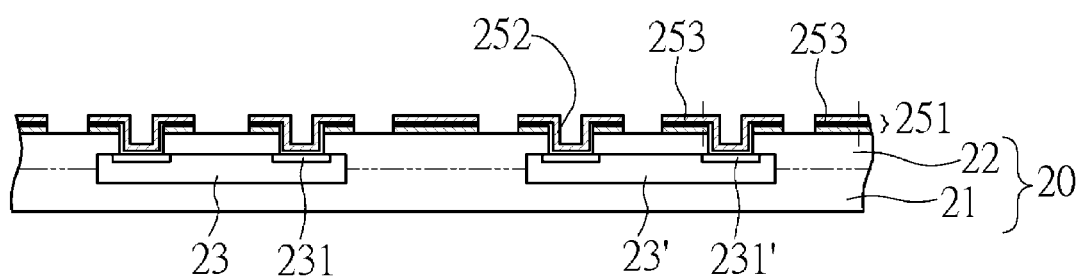

FIGS. 3A through 3C are cross-sectional views of a second embodiment of a stacked semiconductor device and a method for fabricating the same according to the present invention. Unlike the first embodiment, the second embodiment teaches forming the first circuit layer by electroplating.

Referring to FIG. 3A, like what is shown in FIG. 2D, the plurality of vias 220 are formed in the second flexible layer 22 and the metal layer 221 thereon so as to expose portions of the electrode pads 231, 231' on the semiconductor chips 23, 23' sandwiched in between the first and second flexible layers 21, 22. The conductive layer 222 is formed on the metal layer 221, surfaces of the vias 220, and a portion of the electrode pads 231, 231'. The resist layer 24 is formed on the conductive layer 222. A plurality of open areas 240 are formed in the resist layer 24 so as to expose parts of the conductive layer 222.

Referring to FIG. 3B, the electroplated metal layer 223 is formed on the conductive layer 222 exposed from the open areas 240 of the resist layer 24.

Referring to FIG. 3C, the resist layer 24, together with the conductive layer 222 and metal layer 221 under the resist layer 24, is removed, so as to form the first circuit layer 251, also a plurality of first conductive vias 252 in the second flexible layer 22, electrically connecting the first circuit layer 251 and the electrode pads 231, 231'. The first circuit layer 251 has the plurality of conductive pads 253.

Afterward, the steps shown in FIGS. 2E through 2K in the first embodiment are carried out without being described herein again for the sake of brevity.

The present invention provides a stacked semiconductor device and a method for fabricating the same. The method comprises: providing at least two semiconductor chips sandwiched in between a first flexible layer and a second flexible layer combined together to serve as a flexible substrate body with the semiconductor chips embedded therein, wherein a first circuit layer is formed on the second flexible layer and electrically connected to the semiconductor chips; bending the flexible substrate body and sandwiching in an adhesive layer between a face-to-face surface of the first flexible layer, so as to form a stack structure of the semiconductor chips. Embedding the semiconductor chips in the first and second flexible layers reduces package height and enables miniaturization of packages. Bending the flexible substrate body to stack up the semiconductor chips simplifies a fabrication process and reduces costs.

The foregoing specific embodiments are only illustrative of the features and functions of the present invention but are not intended to restrict the scope of the present invention. It is apparent to those ordinarily skilled in the art that all equivalent modifications and variations made in the foregoing embodiment according to the spirit and principle in the disclosure of the present invention should fall within the scope of the appended claims.

What is claimed is:

1. A stacked semiconductor device, comprising:
a first flexible layer and a second flexible layer combined together, serving as a flexible substrate body, the second flexible layer having a surface with a first circuit layer disposed thereon, and the flexible substrate body being bent somewhere such that a surface of the first flexible layer itself is face-to-face clipped, wherein the first circuit layer is free from being in contact with the first flexible layer;
at least two semiconductor chips each embedded in the first and second flexible layers of the flexible substrate body, and having an active surface embedded in the second flexible layer and an opposing inactive surface embedded in the first flexible layer, wherein the active surface has a plurality of electrode pads thereon and electrically connected to the first circuit layer by a plurality of first conductive vias disposed in the second flexible layer; and
an adhesive layer sandwiched in a gap between the face-to-face surface of the first flexible layer so as to stack up the semiconductor chips.

2. The stacked semiconductor device of claim 1, wherein the first circuit layer has a plurality of conductive pads.

3. The stacked semiconductor device of claim 2, further comprising an insulated protective layer disposed on the second flexible layer and the first circuit layer and having a plurality of openings therein so as to expose the conductive pads, respectively.

4. The stacked semiconductor device of claim 3, wherein the flexible substrate body is further bent elsewhere such that a surface of the insulated protective layer itself is face-to-face clipped.

5. The stacked semiconductor device of claim 4, further comprising another adhesive layer sandwiched in a gap between the face-to-face surface of the insulated protective layer so as to stack up another semiconductor chips.

6. The stacked semiconductor device of claim 1, further comprising a circuit build-up structure disposed on the second flexible layer and the first circuit layer, wherein the circuit build-up structure comprises at least a dielectric layer, a second circuit layer disposed on the dielectric layer, and a plurality of second conductive vias disposed in the dielectric layer and electrically connecting to the second circuit layer, in which a portion of the second conductive vias electrically connect to the first circuit layer, and the outmost second circuit layer has a plurality of conductive pads.

7. The stacked semiconductor device of claim 6, further comprising an insulated protective layer disposed on the circuit build-up structure and having a plurality of openings therein so as to expose the conductive pads, respectively.

8. The stacked semiconductor device of claim 7, wherein the flexible substrate body is further bent elsewhere such that a surface of the insulated protective layer itself is face-to-face clipped.

9. The stacked semiconductor device of claim 8, further comprising another adhesive layer sandwiched in a gap between the face-to-face surface of the insulated protective layer so as to stack up another semiconductor chips.

10. A method for fabricating a stacked semiconductor device, comprising the steps of:
providing a first flexible layer and a second flexible layer;
sandwiching in at least two semiconductor chips between the first and second flexible layers, then combining together the first and second flexible layers to serve as a flexible substrate body with the semiconductor chips embedded in the first and second flexible layers, wherein each of the semiconductor chips has an active surface embedded in the second flexible layer with a plurality of electrode pads thereon and an opposing inactive surface embedded in the first flexible layer;
forming a first circuit layer on the second flexible layer, also forming a plurality of first conductive vias in the second flexible layer, electrically connecting the first circuit layer and the electrode pads, wherein the first circuit layer is free from being in contact with the first flexible layer;

forming an adhesive layer on a portion of the first flexible layer; and bending somewhere the flexible substrate body so as to allow the adhesive layer to adhere to an adhesive-layer-free portion of the first flexible layer, such that a surface of the first flexible layer itself is face-to-face clipped, thereby stacking up the semiconductor chips.

11. The method for fabricating a stacked semiconductor device of claim 10, wherein the first circuit layer has a plurality of conductive pads.

12. The method for fabricating a stacked semiconductor device of claim 10, further comprising forming an insulated protective layer on the second flexible layer and the first circuit layer, and forming a plurality of openings in the insulated protective layer so as to expose the conductive pads, respectively.

13. The method for fabricating a stacked semiconductor device of claim 12, further comprising forming another adhesive layer on a portion of the insulated protective layer and then bending elsewhere the flexible substrate body so as to allow the adhesive layer to adhere to an adhesive-layer-free portion of the insulated protective layer, such that a surface of the insulated protective layer itself is face-to-face clipped, thereby stacking up another semiconductor chips.

14. The method for fabricating a stacked semiconductor device of claim 10, further comprising forming a circuit build-up structure on the second flexible layer and the first circuit layer, wherein the circuit build-up structure comprises at least a dielectric layer, a second circuit layer formed on the dielectric layer, and a plurality of second conductive vias formed in the dielectric layer and electrically connecting to the second circuit layer, in which a portion of the second conductive vias electrically connect to the first circuit layer, and the outmost second circuit layer has a plurality of conductive pads.

15. The method for fabricating a stacked semiconductor device of claim 14, further comprising forming an insulated protective layer on the circuit build-up structure, and forming a plurality of openings in the insulated protective layer so as to expose the conductive pads, respectively.

16. The method for fabricating a stacked semiconductor device of claim 15, further comprising forming another adhesive layer on a portion of the insulated protective layer and then bending elsewhere the flexible substrate body so as to allow the adhesive layer to adhere to an adhesive-layer-free portion of the insulated protective layer, such that a surface of the insulated protective layer itself is face-to-face clipped, thereby stacking up another semiconductor chips.

* * * * *